(12) United States Patent
Kim

(10) Patent No.: US 7,670,897 B2
(45) Date of Patent: Mar. 2, 2010

(54) SEMICONDUCTOR DEVICE AND METHOD FOR FABRICATING THE SAME

(75) Inventor: Soo-Hong Kim, Gangdong-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/203,079

(22) Filed: Sep. 2, 2008

(65) Prior Publication Data

US 2009/0065759 A1 Mar. 12, 2009

(30) Foreign Application Priority Data

Sep. 7, 2007 (KR) .................... 10-2007-0090758

(51) Int. Cl.
*H01L 21/8234* (2006.01)

(52) U.S. Cl. .................. 438/237; 257/341; 257/351; 257/355; 257/368; 257/369; 257/E21.211; 438/16; 438/207; 438/215; 438/268; 438/296

(58) Field of Classification Search ............... 257/359, 257/452; 438/215, 222
See application file for complete search history.

(56) References Cited

U.S. PATENT DOCUMENTS 6,608,744 B1 * 8/2003 Kato ...................... 361/111

FOREIGN PATENT DOCUMENTS

KR 10-2004-0091554 5/2006

* cited by examiner

*Primary Examiner*—N Drew Richards
*Assistant Examiner*—Kyoung Lee
(74) *Attorney, Agent, or Firm*—Sherr & Vaughn, PLLC

(57) ABSTRACT

A non-volatile memory semiconductor device and a method for fabricating the same are disclosed. The semiconductor device includes a PN junction diode formed over a semiconductor substrate. Insulating films may be formed over the PN junction diode and patterned to have via holes. A resistive random access memory including a first metal pattern may be in contact with a first region of the PN junction diode. An oxide film pattern may be formed over the first metal pattern and a second metal pattern formed over the oxide film pattern. The first metal pattern, the oxide film pattern and the second metal pattern may be formed in the via holes.

20 Claims, 7 Drawing Sheets

○ On state : "0"
● Off state : "1"

SEMICONDUCTOR DEVICE AND METHOD FOR FABRICATING THE SAME

The present application claims priority under 35 U.S.C. 119 to Korean Patent Application No. 10-2007-0090758 (filed on Sep. 7, 2007), which is hereby incorporated by reference in its entirety.

BACKGROUND

A flash memory used as a non-volatile memory stores data by storing or removing electrons from floating polysilicon or silicon nitride to change a threshold voltage $V_{th}$. Recently, a phase change memory (PRAM), a magnetic memory (MRAM) and the like have stored data by changing a resistance using externally applied heat or magnetic fields. Although research has been done on a resistive random access memory (ReRAM) using voltage to change the resistance of an oxide film, the development of the structure of the ReRAM has been insufficient.

SUMMARY

Embodiments relate to a semiconductor device, and more particularly to a non-volatile memory semiconductor device and a method for fabricating the same. Embodiments relate to a resistive random access memory (ReRAM) in which resistance of an oxide film may be changed according to voltage application, that is, a non-volatile memory semiconductor device capable of selectively operating a cell and a method for fabricating the same.

Embodiments relate to a semiconductor device which includes a PN junction diode formed over a semiconductor substrate. Insulating films may be formed over the PN junction diode and patterned to have via holes. A resistive random access memory including a first metal pattern may be in contact with a first region of the PN junction diode. An oxide film pattern may be formed over the first metal pattern and a second metal pattern formed over the oxide film pattern. The first metal pattern, the oxide film pattern and the second metal pattern may be formed in the via holes.

Embodiments relate to a method for fabricating a semiconductor device which includes: forming a first impurity region by implanting first impurities into a semiconductor substrate; forming a second impurity region by implanting second impurities into the first impurity region; forming a first insulating film over the semiconductor substrate and forming a first via hole in the first insulating film to expose a portion of the second impurity region; forming a first metal pattern in the first via hole by depositing a metal film over the first insulating film and polishing the metal film; forming a second insulating film over the first insulating film and forming a second via hole in the second insulating film to expose the first metal pattern; forming an oxide film pattern in the second via hole by depositing an oxide film over the second insulating film and polishing the oxide film; forming a third insulating film over the second insulating film and forming a third via hole in the third insulating film to expose the oxide film pattern; and forming a second metal pattern in the third via hole by depositing a metal film over the third insulating film and polishing the metal film.

In the semiconductor device having the resistive random access memory according to embodiments, it is easy to operate the cells without influencing a neighboring cell. Further, it is possible to uniformly and stably fabricate a high-efficiency non-volatile memory device.

DRAWINGS

DESCRIPTION

Figure 1:
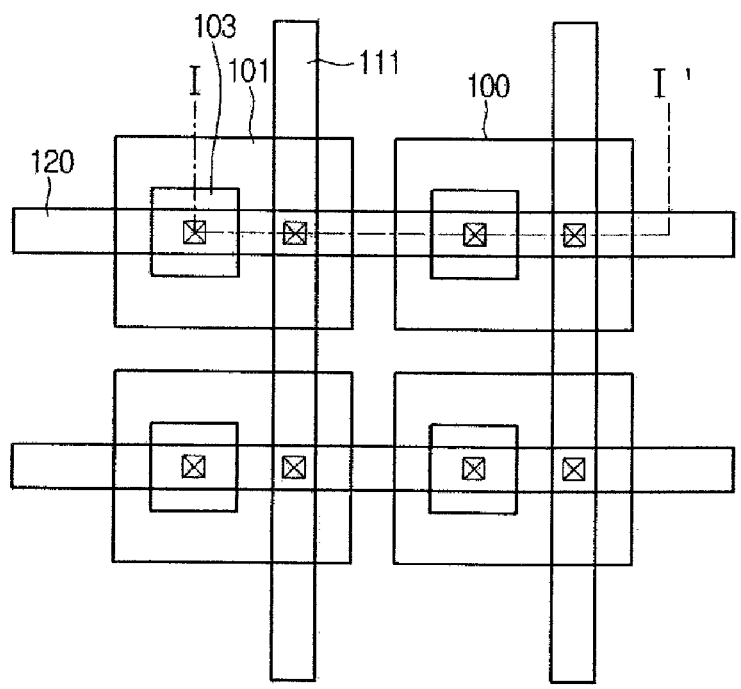
FIG. 1 illustrates a plan view showing a portion of a semiconductor device according to embodiments.
Figure 2:
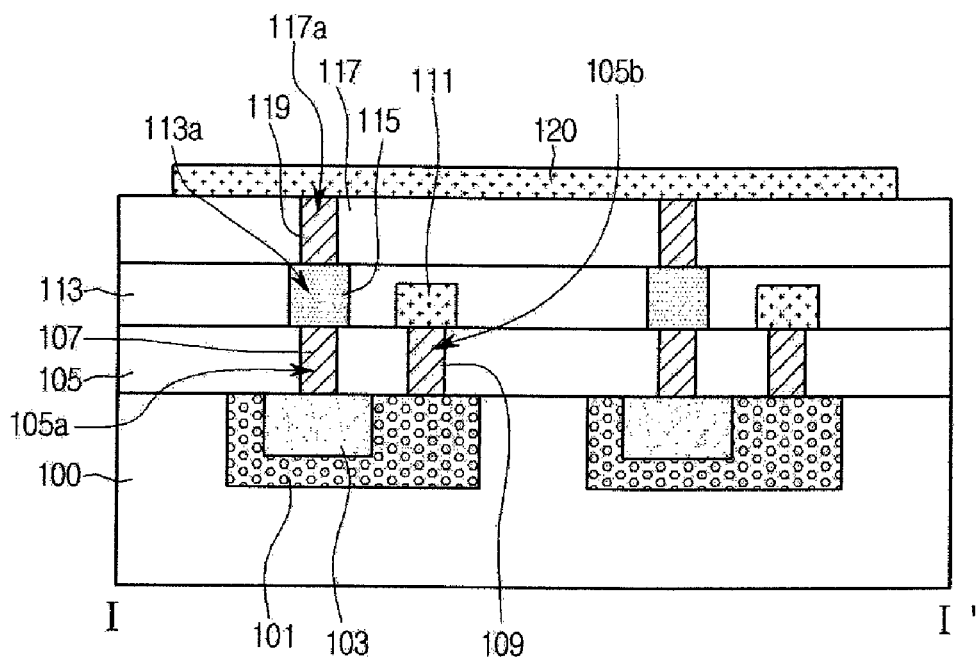
FIG. 2 illustrates a cross-sectional view taken along a line I-I' of FIG. 1.

FIG. 1 illustrates a plan view showing a portion of a semiconductor device according to embodiments. FIG. 2 illustrates a cross-sectional view taken along a line I-I' of FIG. 1. FIGS. 1 and 2 illustrate cells formed on a semiconductor substrate 100. A first impurity region 101 may be formed by implanting first impurities in the semiconductor substrate 100. A second impurity region 103 may be formed by implanting second impurities into the first impurity region 101. The first impurity region 101 and the second impurity region 103 may form a PN junction diode. A resistive random access memory may include a first metal pattern 107, an oxide film pattern 115 and a second metal pattern 119 which may be formed over the second impurity region 103.

The first metal pattern 107 may be formed in a first via hole 105a of a first insulating film 105 formed over the semiconductor substrate 100. The oxide film pattern 115 may be formed in a second via hole 113a of a second insulating film 113 formed over the first insulating film 105. The second metal pattern 119 may be formed in a third via hole 117a of a third insulating film 117 formed over the second insulating film 113.

A third metal pattern 109 may be formed over the first impurity region 101. The third metal pattern 109 may be formed in a fourth via hole 105b formed in the first insulating film 105. A first metal line 111 in contact with the third metal pattern 109 may be formed between the first insulating film 105 and the second insulating film 113. A second metal line 120 in contact with the second metal pattern 119 may be formed over the third insulating film 117.

The semiconductor substrate 100 may include, for example, a silicon substrate, a silicon-on-insulator (SOI) substrate, a gallium arsenic substrate, a silicon germanium substrate, a ceramic substrate, a quartz substrate and a glass substrate for display. The first impurities may be, for example, p-type impurities, and the second impurities may be n-type impurities. Alternately, the first impurities may be n-type impurities, and the second impurities may be p-type impurities. Each of the first to third insulating films 105, 113 and 117 may include at least one of an oxide film and a nitride film. The first metal pattern 107, the oxide film pattern 115 and the second metal pattern 119 may have the same cross-sectional size or different cross-sectional sizes.

The cells of the semiconductor device can be selectively operated by connecting the PN junction diode to the resistive random access memory. The voltage-current characteristics of the resistive random access memory have an on state ("0") and an off state ("1") even when voltage is positive (+). The ReRAM also has an on state and an off state when voltage is negative (−), thereby providing a large range of reading voltage $V_{read}$. Accordingly, it is not easy to isolate the cells from each other, and therefore difficult to operate only a desired cell. However, in embodiments, when the PN junction diode is connected to the resistive random access memory, since the resistive random access memory has an on state and an off state only when voltage is positive, it is easy to control the cells.

The resistive random access memory may be used as a non-volatile memory because a specific voltage applied to a thin film rapidly changes the resistance of the thin film. The resistive random access memory is not degraded due to infinite recording and reproduction. The resistive random access memory can be operated at a relatively high temperature and is non-volatile to provide excellent data safety.

Further, the resistive random access memory can be operated at a relatively high speed of about 10~20 ns. Since it has a single film structure, high integration and high speed can be achieved. Since it is basically fabricated as a single layer structure, energy consumption can be minimized by using a related CMOS process and an integration process technology.

Figure 3:
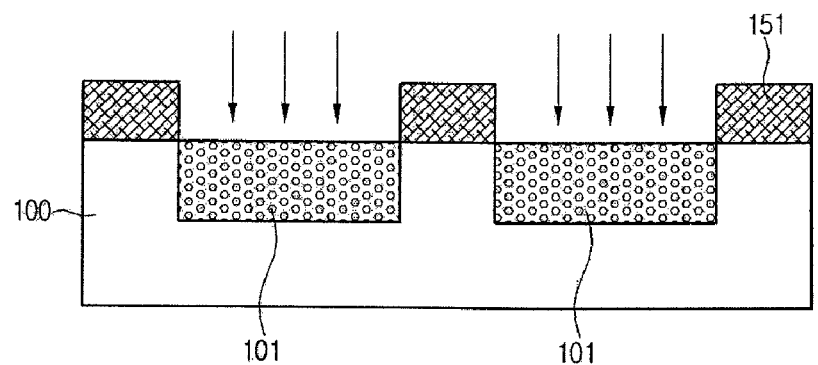
FIGS. 3 to 14 illustrate cross-sectional views showing a method for fabricating a semiconductor device according to embodiments.

FIGS. 3 to 14 illustrate cross-sectional views showing a method for fabricating a semiconductor device according to embodiments. As shown in FIG. 3, a first photoresist pattern 151 may be formed over the semiconductor substrate 100. Then, ions may be implanted into the semiconductor substrate 100 using the first photoresist pattern 151 as a mask to form the first impurity region 101. The first impurity region 101 can be formed by implanting n-type or p-type impurities.

Figure 4:
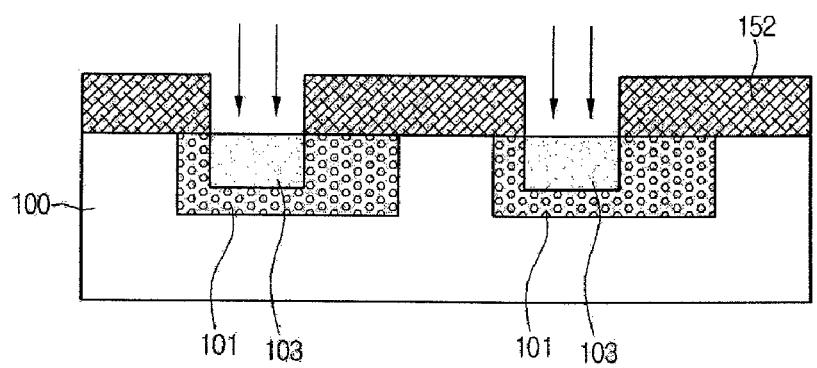

Next, as shown in FIG. 4, after the first photoresist pattern 151 is removed, a second photoresist pattern 152 may be formed over the semiconductor substrate 100 having the first impurity region 101. Then, ions may be implanted into the semiconductor substrate 100 using the second photoresist pattern 152 as a mask to form the second impurity region 103. The second impurity region 103 can be formed in the first impurity region 101. The second impurity region 103 may be formed by implanting impurities opposite to the impurities implanted into the first impurity region 101. The second impurity region 103 may be formed by implanting p-type impurities or n-type impurities.

Figure 5:
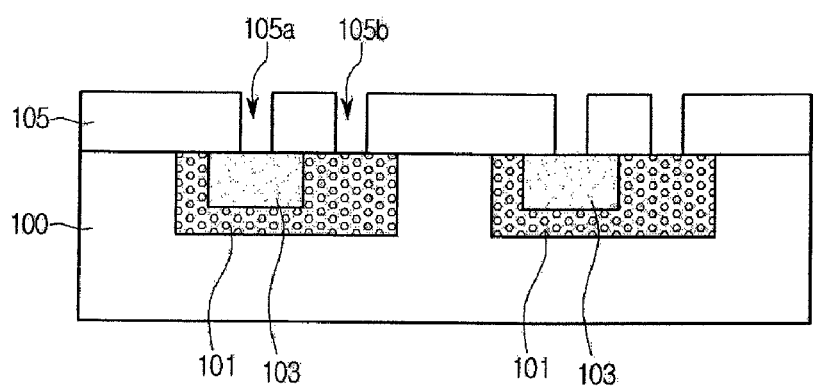

As shown in FIG. 5, after the second photoresist pattern 152 is removed, the first insulating film 105 having the first via hole 105a and the fourth via hole 105b may be formed on the semiconductor substrate 100 having the first impurity region 101 and the second impurity region 103. The first insulating film 105 may include at least one of an oxide film and a nitride film. The first via hole 105a may expose a portion of the second impurity region 103. The fourth via hole 105b may expose a portion of the first impurity region 101.

Figure 6:
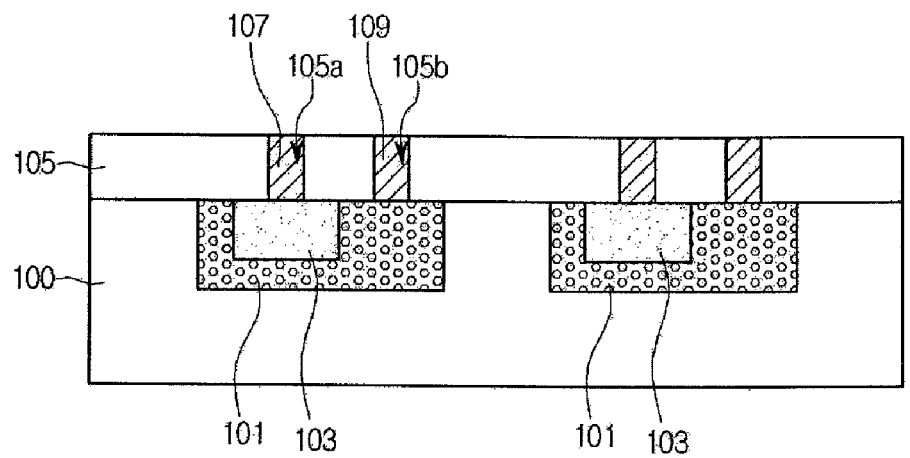

As shown in FIG. 6, a metal film may be formed over the first insulating film 105 having the first via hole 105a and the fourth via hole 105b. The metal film may be polished to expose the upper surface of the first insulating film 105, thereby forming the first metal pattern 107 and the third metal pattern 109 filling the first via hole 105a and the fourth via hole 105b, respectively.

The first metal pattern 107 may be formed of a metal selected from a group consisting of Ni, Zr, Pt, Au, Al, Cu and Ti, or an alloy thereof. The metal film may be formed by a pulsed laser deposition (PLD) method, a physical vapor deposition (PVD) method, a chemical vapor deposition (CVD) method or a method using both PVD and CVD. The metal film may be polished by a chemical mechanical polishing (CMP) method.

Figure 7:
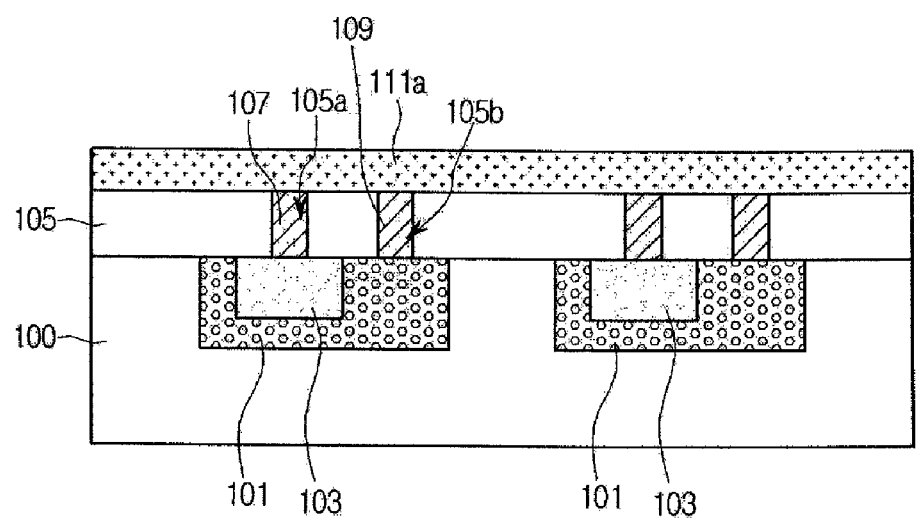
Figure 8:
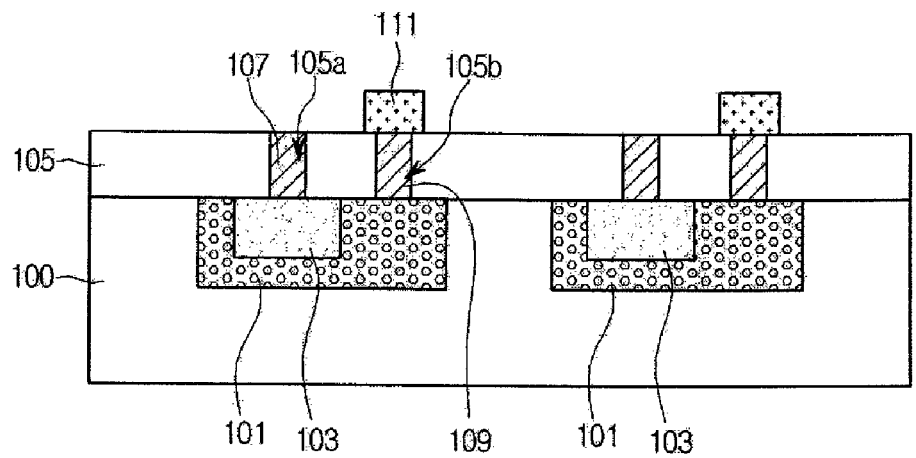

As shown in FIG. 7, a metal film 111a for forming a line may be formed over the first insulating film 105. Then, as shown in FIG. 8, the metal film 111a may be patterned to form the first metal line 111 in contact with the third metal pattern 109 and formed in one direction.

Figure 9:
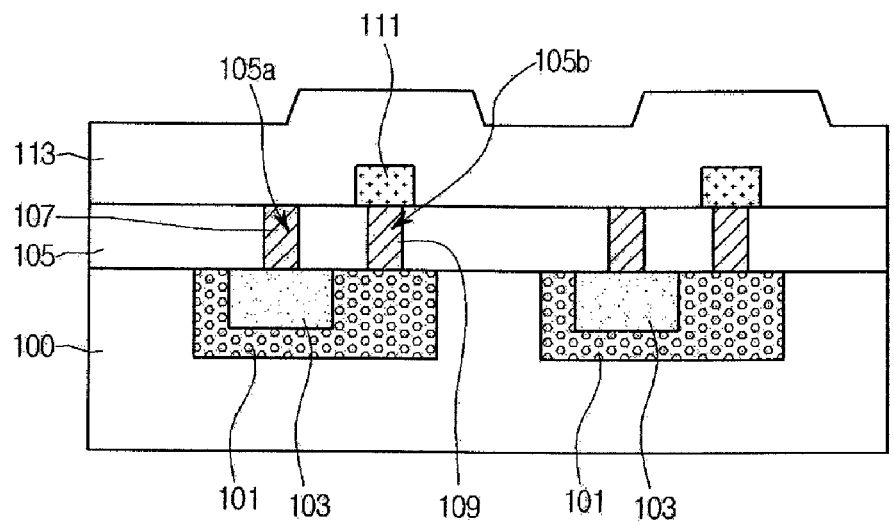
Figure 10:
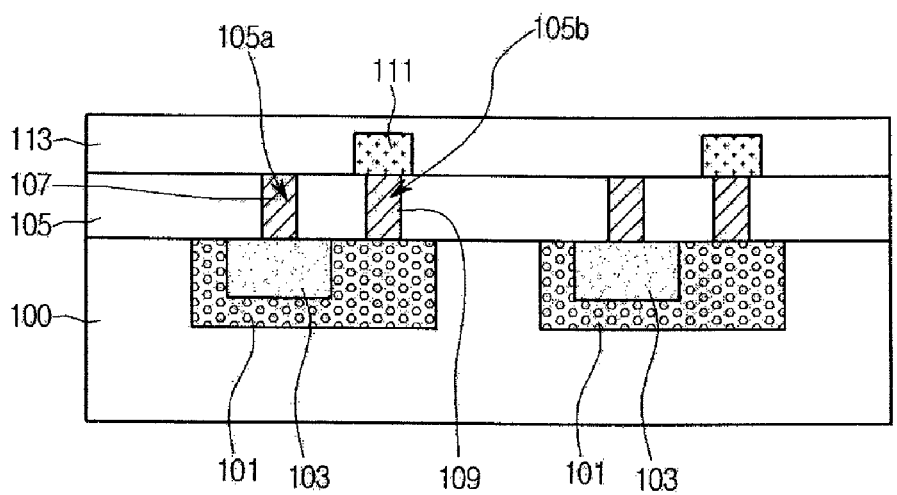

Thereafter, as shown in FIG. 9, the second insulating film 113 may be formed over the first insulating film 105 and the first metal line 111. The second insulating film 113 may include at least one of an oxide film and a nitride film. The upper surface of the second insulating film 113 may be uneven due to the thickness of the first metal line 111. Accordingly, as shown in FIG. 10, the upper surface of the second insulating film 113 may be polished for planarization.

Figure 11:
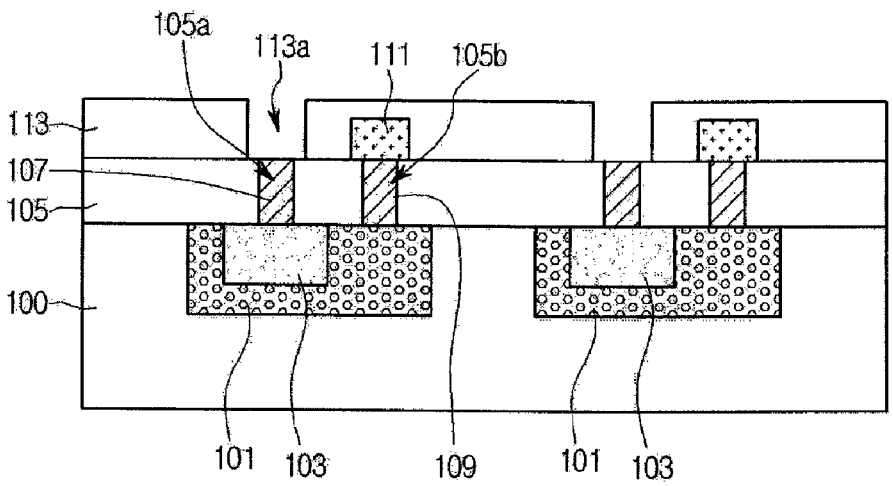
Figure 12:
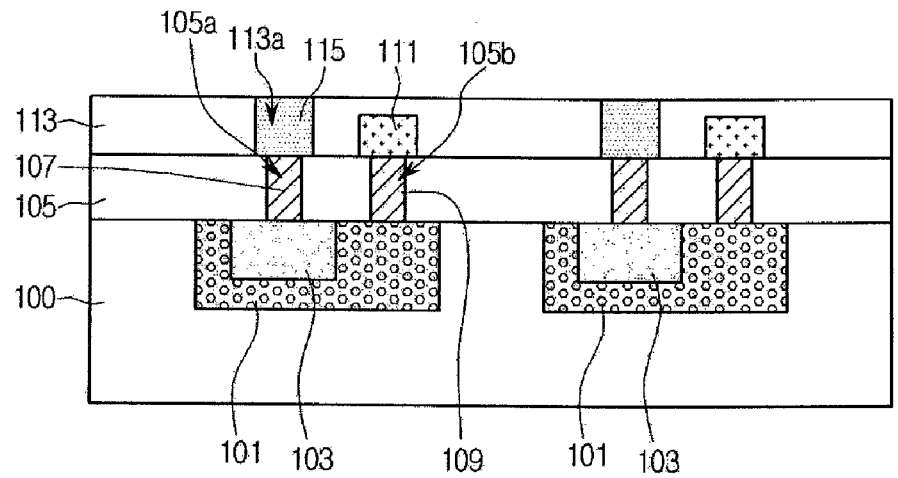

As shown in FIG. 11, the planarized second insulating film 113 may be selectively etched, thereby forming the second via hole 113a in the second insulating film 113 to expose the first metal pattern 107. As shown in FIG. 12, an oxide film may be formed over the second insulating film 113 having the third via hole 113a. Then, the oxide film may be polished to expose the upper surface of the second insulating film 113, thereby forming the oxide film pattern 115 in the second via hole 113a. The oxide film may be formed by oxidizing a metal film after forming the metal film.

Figure 13:
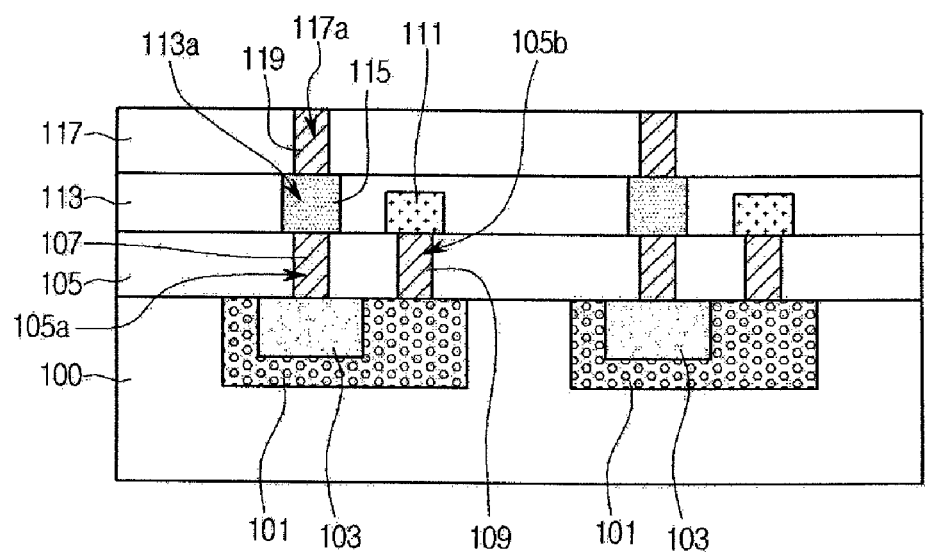

Then, as shown in FIG. 13, the third insulating film 117 may be formed over the second insulating film 113 having the oxide film pattern 115. The third insulating film 117 may have the third via hole 117a for exposing the oxide film pattern 115. A metal film may be formed over the third insulating film 117 having the third via hole 117a. The metal film may be polished to expose the third insulating film 117, thereby forming the second metal pattern 119 filled in the third via hole 117a.

The second metal pattern 119 may be formed of a metal selected from a group consisting of Ni, Zr, Pt, Au, Al, Cu and Ti or an alloy thereof. The metal film may be formed by a pulsed laser deposition (PLD) method, a physical vapor deposition (PVD) method, a chemical vapor deposition (CVD) method or a method using both PVD and CVD. The metal film may be polished by a chemical mechanical polishing (CMP) method.

Figure 14:
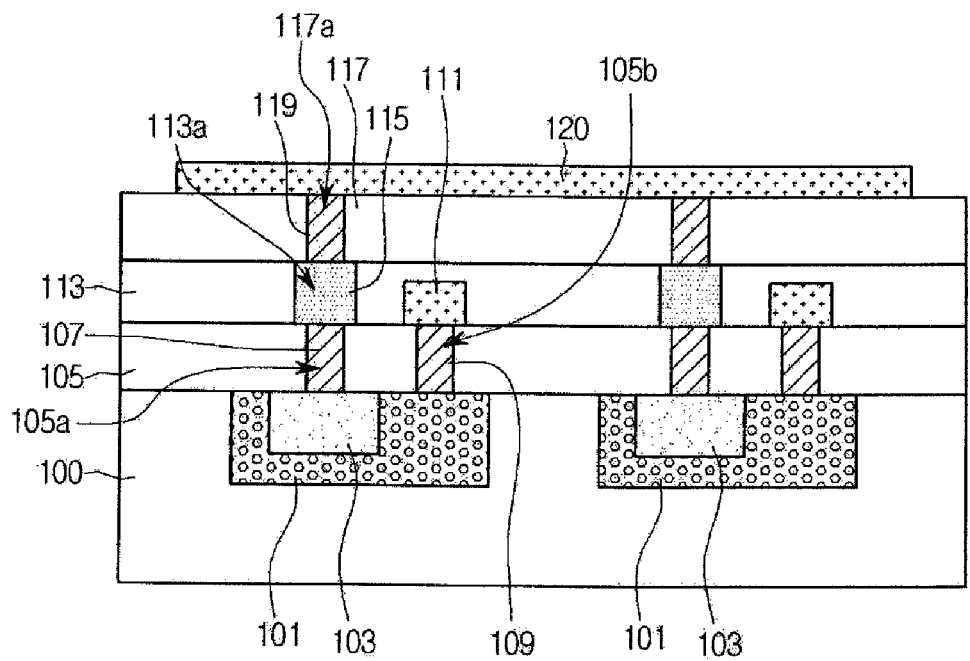

As shown in FIG. 14, a metal film for forming a line may be formed over the third insulating film 117 having the second metal pattern 119. The metal film may be patterned, thereby forming a second metal line 120 in contact with the second metal pattern 119. The second metal line 120 may be formed in a direction intersecting the first metal line 111.

Figure 15A:
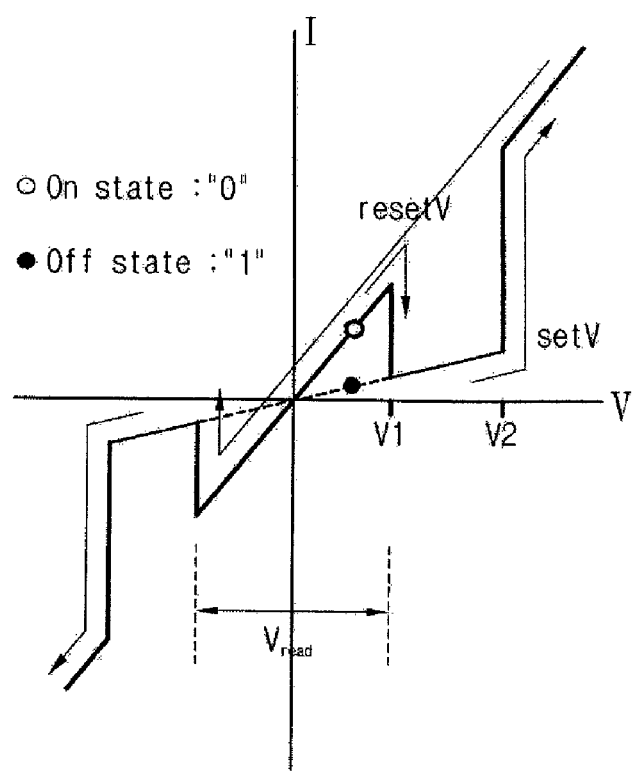
FIG. 15A is a graph showing the voltage-current characteristics of a resistive random access memory.
Figure 15B:
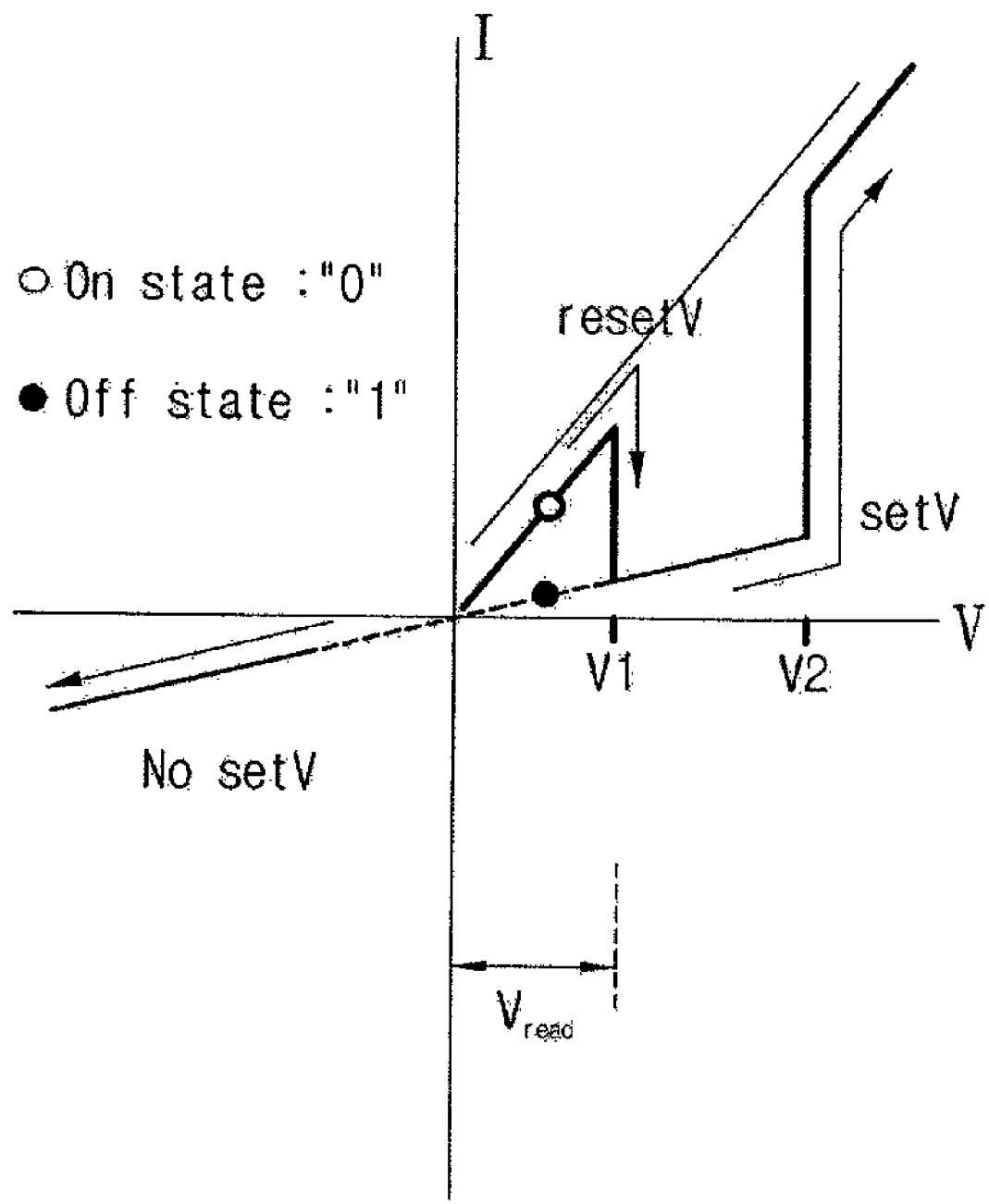
FIG. 15B is a graph showing the voltage-current characteristics of a resistive random access memory according to embodiments.

FIG. 15A is a graph showing the voltage-current characteristics of a resistive random access memory. FIG. 15B is a graph showing the voltage-current characteristics of the resistive random access memory according to embodiments. FIG. 15A is a comparison graph obtained by measuring the amount of current in a resistive random access memory including a first metal pattern, an oxide film pattern and a second metal pattern while changing the resistance of the oxide film pattern by applying voltage to the first metal pattern and the second metal pattern.

FIG. 15B is a graph obtained by measuring the amount of current while changing the resistance of the oxide film pattern 115 by connecting the PN junction diode 101 and 103 to the resistive random access memory including the first metal pattern 107, the oxide film pattern 115 and the second metal pattern 119 and applying voltage between the resistive random access memory 107, 115 and 119 and the PN junction diode 101 and 103.

As shown in FIG. 15A, in the comparison graph, the resistive random access memory may have an on state and an off state according to the variation of resistance. The resistance may be reversibly changed according to the variation of external voltage even if the voltage is positive or negative.

The voltage-current characteristics of the resistive random access memory have an on state ("0") and an off state ("1") even when voltage is positive (+). The ReRAM also has an on state and an off state when voltage is negative (−), thereby providing a large range of reading voltage Vread. Accordingly, it is not easy to isolate the cells from each other, and therefore difficult to operate only a desired cell.

However, as shown in FIG. 15B, in the graph according to embodiments, when the PN junction diode 101 and 103 is connected to the resistive random access memory 107, 115 and 119, since the resistive random access memory has an on state and an off state only when voltage is positive, it is easy to control the cells.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
    a PN junction diode formed over a semiconductor substrate;
    insulating films formed over the PN junction diode and patterned to have via holes; and
    a resistive random access memory including a first metal pattern in contact with a first region of the PN junction diode, an oxide film pattern formed over the first metal pattern and a second metal pattern formed over the oxide film pattern, wherein the first metal pattern, the oxide film pattern and the second metal pattern are formed in the via holes.

2. The apparatus of claim 1, wherein the resistive random access memory comprises:
    a first metal line connected to a second region of the PN junction diode; and
    a second metal line connected to the second metal pattern.

3. The apparatus of claim 1, wherein the PN junction diode comprises:
    a first impurity region formed by implanting first impurities in the semiconductor substrate; and
    a second impurity region formed by implanting second impurities into a portion of the first impurity region.

4. The apparatus of claim 2, wherein the PN junction diode includes:
    a first impurity region formed by implanting first impurities into the semiconductor substrate; and
    a second impurity region formed by implanting second impurities into a portion of the first impurity region.

5. The apparatus of claim 4, wherein the first impurities are n-type impurities and the second impurities are p-type impurities.

6. The apparatus of claim 5, wherein the first metal pattern is in contact with the second impurity region and the first metal line is connected to the first impurity region.

7. The apparatus of claim 1, wherein the insulating films include:
    a first insulating film having a first via hole and the first metal pattern formed in the first via hole;
    a second insulating film formed over the first insulating film and having a second via hole and the oxide film pattern formed in the second via hole; and
    a third insulating film formed over the second insulating film and having a third via hole and the second metal pattern formed in the third via hole.

8. The apparatus of claim 6, wherein the insulating films includes:
    a first insulating film having a first via hole, a fourth via hole, the first metal pattern formed in the first via hole and a third metal pattern formed in the fourth via hole;
    a second insulating film formed over the first insulating film and having a second via hole and the oxide film pattern formed in the second via hole; and
    a third insulating film formed over the second insulating film and having a third via hole and the second metal pattern formed in the third via hole.

9. The apparatus of claim 8, wherein the first via hole, the second via hole, and the third via hole are arranged in a vertical line.

10. The apparatus of claim 8, wherein the first metal pattern is in contact with the second impurity region and the third metal pattern is in contact with the first impurity region.

11. The apparatus of claim 1, wherein the first metal pattern comprises at least one of Ni, Zr, Pt, Au, Al, Cu, and Ti.

12. The apparatus of claim 1, wherein the second metal pattern comprises at least one of Ni, Zr, Pt, Au, Al, Cu and, Ti.

13. A method comprising:
    forming a first impurity region by implanting first impurities into a semiconductor substrate;
    forming a second impurity region by implanting second impurities into the first impurity region;
    forming a first insulating film over the semiconductor substrate and forming a first via hole in the first insulating film to expose a portion of the second impurity region;
    forming a first metal pattern in the first via hole by depositing a metal film over the first insulating film and polishing the metal film;
    forming a second insulating film over the first insulating film and forming a second via hole in the second insulating film to expose the first metal pattern;
    forming an oxide film pattern in the second via hole by depositing an oxide film over the second insulating film and polishing the oxide film;
    forming a third insulating film over the second insulating film and forming a third via hole in the third insulating film to expose the oxide film pattern; and
    forming a second metal pattern in the third via hole by depositing a metal film over the third insulating film and polishing the metal film.

14. The method of claim 13, comprising forming a fourth via hole in the first insulating film to expose a portion of the first impurity region and forming a third metal pattern in the fourth via hole.

15. The method of claim 14, comprising forming a first metal line, connected to the third metal pattern, over the first insulating film.

16. The method of claim 13, comprising forming a second metal line, connected to the second metal pattern, over the third insulating film.

17. The method of claim 13, wherein the first impurities are p-type impurities and the second impurities are n-type impurities.

18. The method of claim 13, comprising planarizing the second insulating film after forming the second insulating film.

19. The method of claim 13, wherein the first metal pattern comprises at least one of Ni, Zr, Pt, Au, Al, Cu, and Ti.

20. The method of claim 13, wherein the second metal pattern comprises at least one of Ni, Zr, Pt, Au, Al, Cu, and Ti.

* * * * *